United States Patent
Ikezaki et al.

(10) Patent No.: US 9,435,872 B2
(45) Date of Patent: Sep. 6, 2016

(54) LABELING AREA DETERMINING APPARATUS, MAGNETIC RESONANCE APPARATUS AND METHOD FOR DETERMINING TILT OF LABELING AREA

(71) Applicant: GE Medical Systems Global Technology Company, LLC, Waukesha, WI (US)

(72) Inventors: Yoshikazu Ikezaki, Tokyo (JP); Marie Uno, Tokyo (JP)

(73) Assignee: General Electric Company, Schenectady, NY (US)

( * ) Notice: Subject to any disclaimer, the term of this patent is extended or adjusted under 35 U.S.C. 154(b) by 542 days.

(21) Appl. No.: 13/934,778

(22) Filed: Jul. 3, 2013

(65) Prior Publication Data

US 2014/0009155 A1 Jan. 9, 2014

(30) Foreign Application Priority Data

Jul. 6, 2012 (JP) ................................ 2012-151947

(51) Int. Cl.
| | |
|---|---|
| *G01V 3/00* | (2006.01) |
| *G01R 33/56* | (2006.01) |
| *G01R 33/563* | (2006.01) |
| *G01R 33/561* | (2006.01) |

(52) U.S. Cl.
CPC ......... *G01R 33/56* (2013.01); *G01R 33/56366* (2013.01); *G01R 33/5616* (2013.01)

(58) Field of Classification Search
USPC ........................................................ 324/309
See application file for complete search history.

(56) References Cited

U.S. PATENT DOCUMENTS

| | | | |
|---|---|---|---|
| 5,512,827 | A | 4/1996 | Hardy et al. |
| 6,564,080 | B1 | 5/2003 | Kimura |
| 6,678,544 | B2 | 1/2004 | Butts et al. |
| 8,143,892 | B2 | 3/2012 | Briggs et al. |
| 8,441,257 | B2 | 5/2013 | Mordini et al. |
| 2007/0223800 | A1 | 9/2007 | Guehring |
| 2008/0188735 | A1 | 8/2008 | Furudate |
| 2008/0238422 | A1* | 10/2008 | Yui .................... G01R 33/4824 324/307 |

(Continued)

FOREIGN PATENT DOCUMENTS

| | | |
|---|---|---|
| CN | 101332085 A | 12/2008 |
| CN | 101637386 A | 2/2012 |

(Continued)

OTHER PUBLICATIONS

Unofficial English Translation of Chinese Office Action issued in connection with corresponding CN Application No. 201310281294.5 on Jan. 29, 2015.

*Primary Examiner* — Rodney Fuller

(57) ABSTRACT

A labeling area determining apparatus is provided. The labeling area determining apparatus includes a detecting device configured to detect a tilt of a head relative to a body axial direction of a subject to be imaged by an arterial spin labeling method, and a determining device configured to determine a tilt of a labeling area of spins relative to the body axial direction of the subject, based on the tilt of the head detected by the detecting device.

11 Claims, 13 Drawing Sheets

(56) References Cited

U.S. PATENT DOCUMENTS

| | | | | |
|---|---|---|---|---|
| 2009/0149733 | A1* | 6/2009 | Guenther | A61B 5/0263 600/410 |
| 2010/0113915 | A1* | 5/2010 | Briggs | G01R 33/56366 600/419 |
| 2011/0071382 | A1* | 3/2011 | Miyazaki | A61B 5/0037 600/413 |
| 2011/0228998 | A1* | 9/2011 | Vaidya | G01R 33/543 382/131 |
| 2012/0314909 | A1* | 12/2012 | Edelman | A61B 5/7292 382/107 |
| 2013/0229177 | A1* | 9/2013 | Bammer | G01R 33/56341 324/309 |
| 2014/0055135 | A1* | 2/2014 | Nielsen | G01R 33/58 324/309 |
| 2015/0355305 | A1* | 12/2015 | Helle | G01R 33/3854 324/309 |

FOREIGN PATENT DOCUMENTS

| | | |
|---|---|---|
| JP | 2004016613 | 1/2004 |
| JP | 2012061074 | 3/2012 |

* cited by examiner

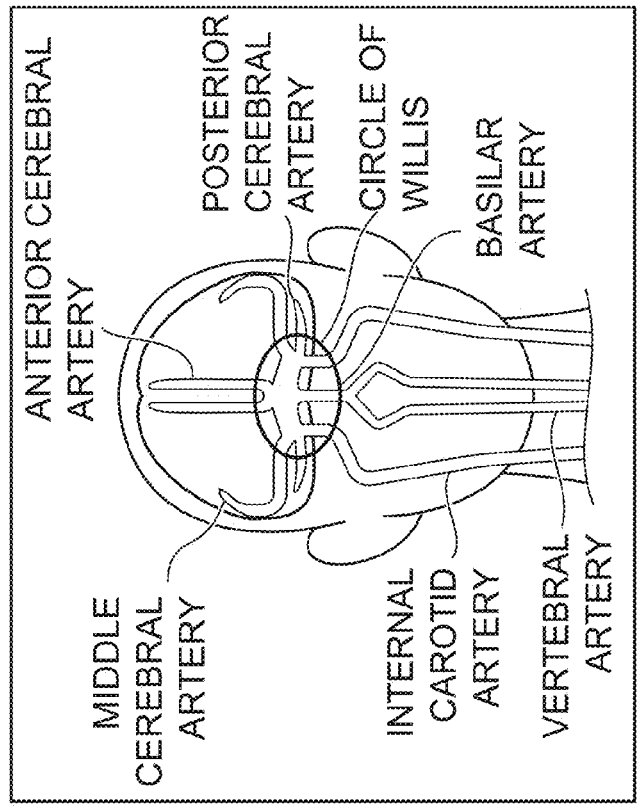
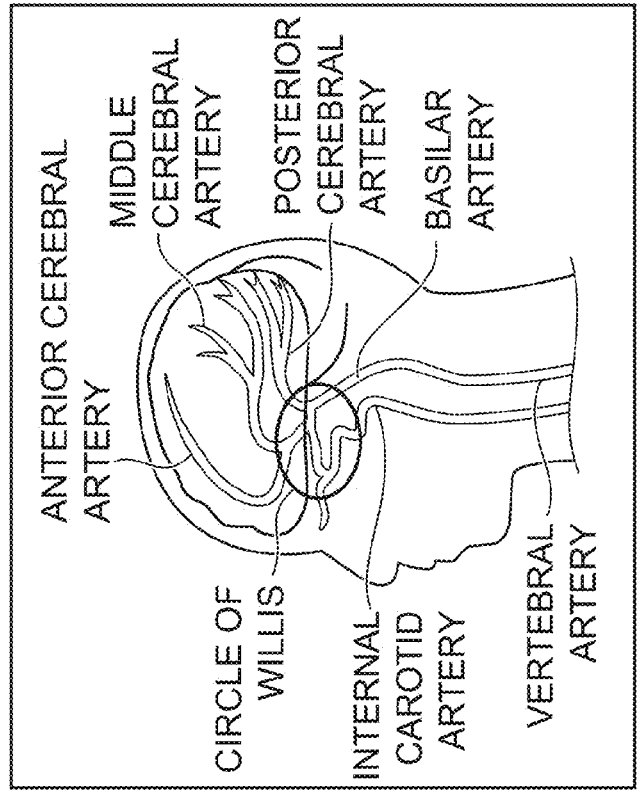
FIG. 13B
FIG. 13A

LABELING AREA DETERMINING APPARATUS, MAGNETIC RESONANCE APPARATUS AND METHOD FOR DETERMINING TILT OF LABELING AREA

CROSS REFERENCE TO RELATED APPLICATIONS

This application claims the benefit of Japanese Patent Application No. 2012-151947 filed Jul. 6, 2012, which is hereby incorporated by reference in its entirety.

BACKGROUND OF THE INVENTION

The present invention relates to a labeling area determining apparatus and a magnetic resonance apparatus which determine a labeling area in an ASL (Arterial Spin Labeling) imaging method, and a program therefor.

In a magnetic resonance imaging (MRI) apparatus, a subject to be imaged is carried in an internal bore of a magnet apparatus, i.e., an imaging space with a static magnetic field formed therein. A gradient magnetic field and an RF (Radio Frequency) magnetic field are applied thereto to excite spins in the subject and thereby generate magnetic resonance signals, whereby an image is reconstructed based on the received signals from the magnetic resonance signals.

Using such an MRI apparatus, there has been known perfusion imaging by an imaging method called ASL. In this imaging, magnetic labeling is performed on each spin on the upstream side of a blood flow of an object to be examined or a subject, and magnetic resonance signals produced by the inflow of the labeled spins in a region of interest are used in the imaging. The labeling may also be called tagging, but is referred to as labeling in the present disclosure.

The labeling is performed by inversion of each spin. When the perfusion of a cerebral blood flow is imaged, the spin's inversion is performed on the neck of a subject, so that a perfusion image about a desired slice of a brain is imaged. The perfusion image is determined as an image of a difference between a label image being a tomographic image with labeling and a control image being a tomographic image with labeling (refer to, for example, Japanese Patent No. 4051232).

In the ASL imaging method, an area (plane) to perform labeling may be an area less reduced in branch and flexion. The area to perform labeling should be determined in such a manner that the direction of the normal to the area substantially coincides with a blood flow direction to prevent timings each provided to cause a labeled blood flow to flow into a region of interest from varying for every blood vessel. For this reason, generally, the labeling area is determined in such a manner that the direction of a normal line substantially coincides with a body axial direction of a subject around a lower part of such a circle of Willis (also called an arterial circle of the cerebrum) as shown in FIGS. 13A and 13B.

When, however, the posture of the head of the subject changes, the arteries lying around the lower part of the circle of Willis are moved/transformed and then tilted, so that an area suitable for labeling also changes. Therefore, when the labeling area is determined as usual in such a manner that the direction of the normal thereto coincides with the body axial direction of the subject, there is a case where the labeling area is not appropriately determined depending on the posture of the head.

With such a foregoing in view, there has been a demand for a technology capable of appropriately determining a labeling area of each spin without depending on the posture of a head to be imaged, upon imaging by the ASL method.

BRIEF DESCRIPTION OF THE INVENTION

In a first aspect, a labeling area determining apparatus is provided. The labeling area determining apparatus includes a detecting device which detects a tilt of a head relative to a body axial direction of a subject to be imaged by an ASL method, and a determining device which determines a tilt of a labeling area of spins relative to the body axial direction of the subject, based on the tilt of the head detected by the detecting device.

In a second aspect, the labeling area determining apparatus of the first aspect is provided, in which the detecting device detects the tilt of the head, based on a slice direction of an imaging area set to the head.

In a third aspect, the labeling area determining apparatus of the first aspect is provided, in which the detecting device detects the tilt of the head, based on a result of analysis of an image obtained by preliminary imaging of the head.

In a fourth aspect, the labeling area determining apparatus of any one of the first through third aspects is provided, in which the detecting device detects a rotational angular component of the head about an AP (Antero-Posterior) axis thereof, and in which the determining device determines the tilt of the labeling area, based on the rotational angular component.

In a fifth aspect, the labeling area determining apparatus of the fourth aspect is provided, in which the determining device determines the tilt of the labeling area in such a manner that the direction of the normal to the labeling area becomes a direction rotated about the AP axis by a rotational angle corresponding to the rotational angular component from the body axial direction.

In a sixth aspect, the labeling area determining apparatus of the fifth aspect is provided, in which the determining device determines the tilt of the labeling area in such a manner that the direction of the normal to the labeling area becomes a direction rotated about the AP axis by substantially the same rotational angle as the rotational angular component from the body axial direction.

In a seventh aspect, the labeling area determining apparatus of any one of the fourth through sixth aspects is provided, in which the detecting device determines a three-dimensional rotation matrix indicative of the tilt of the head and detects a rotational angular component about an AP axis, based on matrix elements of the three-dimensional rotation matrix.

In an eighth aspect, a magnetic resonance apparatus is provided. The magnetic resonance apparatus includes a detecting device which detects a tilt of a head relative to a body axis direction of a subject to be imaged by an ASL method, and a determining device which determines a tilt of a labeling area of spins relative to the body axial direction of the subject, based on the tilt of the head detected by the detecting device.

In a ninth aspect, the magnetic resonance apparatus of the eighth aspect is provided, in which the detecting device detects the tilt of the head, based on a slice direction of an imaging area set to the head.

In a tenth aspect, the magnetic resonance apparatus of the eighth aspect is provided, in which the detecting device detects the tilt of the head, based on a result of analysis of an image obtained by preliminary imaging of the head.

In an eleventh aspect, the magnetic resonance apparatus of any one of the eight through tenth aspects is provided, in which the detecting device detects a rotational angular component of the head about an AP axis, and in which the determining device determines the tilt of the labeling area, based on the rotational angular component.

In a twelfth aspect, the magnetic resonance apparatus of the eleventh aspect is provided, in which the determining device determines the tilt of the labeling area in such a manner that the direction of the normal to the labeling area becomes a direction rotated about the AP axis by a rotational angle corresponding to the rotational angular component from the body axial direction.

In a thirteenth aspect, the magnetic resonance apparatus of the eleventh or twelfth aspect is provided, in which the detecting device determines the tilt of the labeling area in such a manner that the direction of the normal to the labeling area becomes a direction rotated about the AP axis by substantially the same rotational angle as the rotational angular component from the body axial direction.

In a fourteenth aspect, the magnetic resonance apparatus of any one of the eleventh through thirteenth aspects is provided, in which the detecting device determines a three-dimensional rotation matrix indicative of the tilt of the head and detects a rotational angular component about an AP axis, based on matrix elements of the three-dimensional rotation matrix.

In a fifteenth aspect, a program is provided. The program causes a computer to function as a detecting device which detects a tilt of a head relative to a body axial direction of a subject to be imaged by an ASL method, and a determining device which determines a tilt of a labeling area of spins relative to the body axial direction of the subject, based on the tilt of the head detected by the detecting device.

In a sixteenth aspect, the program of the fifteenth aspect is provided, in which the detecting device detects the tilt of the head, based on a slice direction of an imaging area set to the head.

In a seventeenth aspect, the program of the fifteenth aspect is provided, in which the detecting device detects the tilt of the head, based on a result of analysis of an image obtained by preliminary imaging of the head.

In an eighteenth aspect, the program of any one of the fifteenth through seventeenth aspects is provided, in which the detecting device detects a rotational angular component of the head about an AP axis thereof, and in which the determining device determines the tilt of the labeling area, based on the rotational angular component.

In a nineteenth aspect, the program of the eighteenth aspect is provided, in which the determining device determines the tilt of the labeling area in such a manner that the direction of the normal to the labeling area becomes a direction rotated about the AP axis by a rotational angle corresponding to the rotational angular component from the body axial direction.

In a twentieth aspect, the program of the eighteenth or nineteenth aspect is provided, in which the determining device determines the tilt of the labeling area in such a manner that the direction of the normal to the labeling area becomes a direction rotated about the AP axis by substantially the same rotational angle as the rotational angular component from the body axial direction.

According to the above aspects, since the tilt of a labeling area is determined based on the tilt of a head correlated with an area suitable for labeling, the area suitable for the labeling can be determined as a labeling area upon imaging based on an ASL method without depending on the posture of the head.

Further advantages will be apparent from the following description of the exemplary embodiments as illustrated in the accompanying drawings.

BRIEF DESCRIPTION OF THE DRAWINGS

FIGS. 13A and 13B are diagrams for explaining the position of a circle of Willis.

DETAILED DESCRIPTION OF THE INVENTION

An exemplary embodiment will hereinafter be described in detail with reference to the accompanying drawings. Incidentally, the disclosure is not limited to or by the exemplary embodiment.

Figure 1:
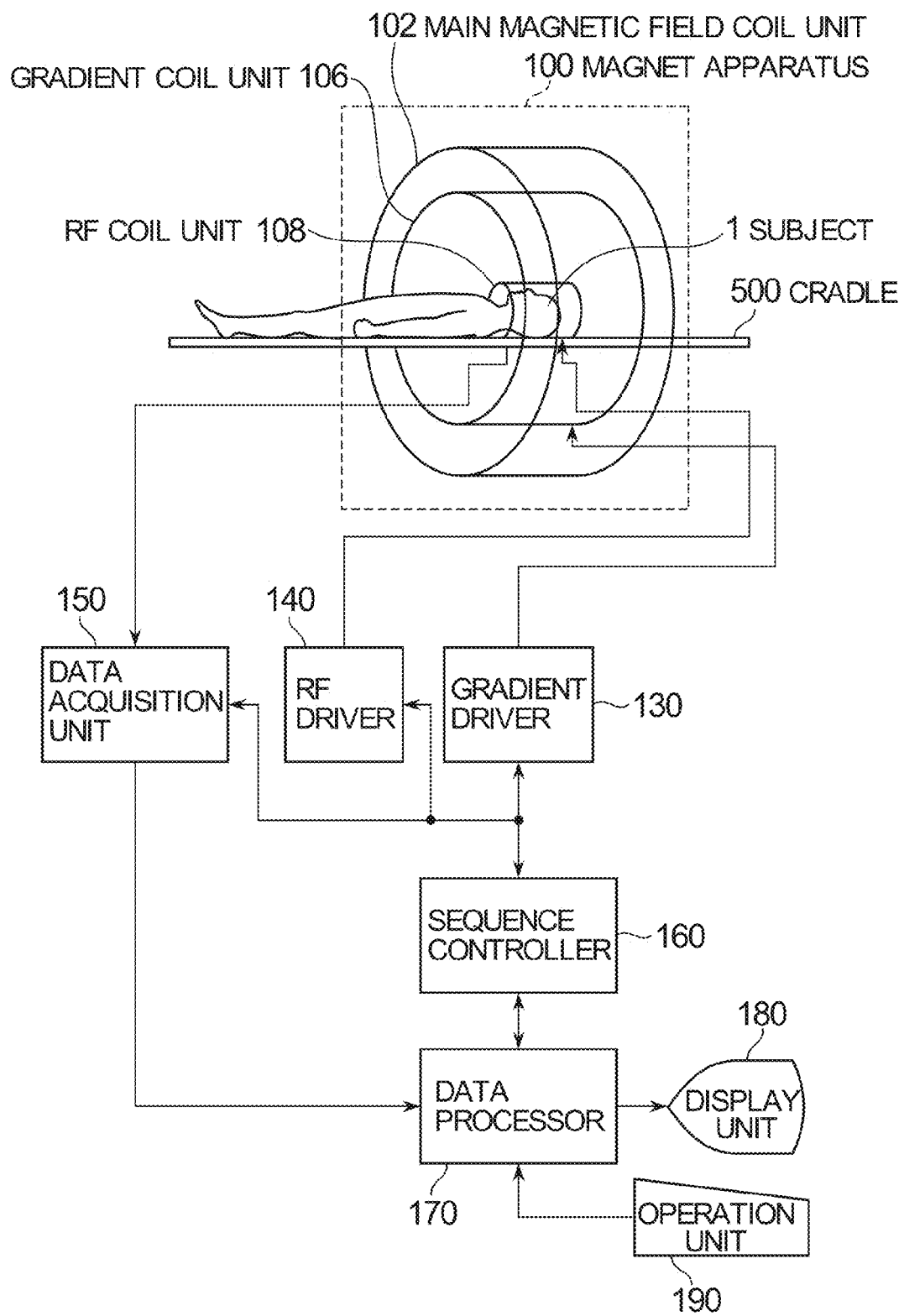
FIG. 1 is a block diagram of a magnetic resonance imaging apparatus of an exemplary embodiment.

A block diagram of a magnetic resonance imaging apparatus is shown in FIG. 1. As shown in the same drawing, the magnetic resonance imaging apparatus has a magnet apparatus 100. The magnet apparatus 100 has a main magnetic field coil unit 102, a gradient coil unit 106 and an RF (Radio Frequency) coil unit 108. These coil units have an approximately cylindrical shape respectively and disposed concentrically with each other. A subject 1 to be imaged is placed on a cradle 500 so as to be carried in an approximately columnar internal space (bore) of the magnet apparatus 100 and carried out therefrom by an unillustrated conveying means. The head of the subject 1 is accommodated within the RF coil unit 108.

The main magnetic field coil unit 102 forms a static magnetic field within the internal bore of the magnetic apparatus 100. The direction of the static magnetic field is approximately parallel to the direction of a body axis of the subject 1. That is, a so-called horizontal magnetic field is formed. The main magnetic field coil unit 102 is configured using, for example, a superconductive coil. Incidentally, the main magnetic field coil unit 102 is not limited to it, but may be configured using a normal conducting coil or the like.

The gradient coil unit 106 generates three gradient magnetic fields for causing a static magnetic field intensity to have gradients in directions of three axes vertical to each other, i.e., a slice axis, a phase axis and a frequency axis, respectively.

When coordinate axes vertical to each other in a static magnetic field space are assumed to be X, Y and Z, any axis can be taken as the slice axis. In that case, one of the two remaining axes is taken as the phase axis, and the other thereof is taken as the frequency axis. The slice, phase and frequency axes are also capable of allowing the X, Y and Z axes to have arbitrary tilts while mutual verticality is being held. In the magnetic resonance imaging apparatus, the direction of the body axis of the subject 1 is assumed to be a Z-axis direction.

The gradient magnetic field in the slice axis direction is also called a slice gradient magnetic field. The gradient magnetic field in the phase axis direction is also called an encode gradient magnetic field or a phase encode gradient magnetic field. The gradient magnetic field in the frequency axis direction is also called a read out gradient magnetic field. The read out gradient magnetic field is synonymous with the frequency encode gradient magnetic field. In order to make it possible to generate such gradient magnetic fields, the gradient coil unit 106 has unillustrated gradient coils of three systems. The gradient magnetic fields will hereinafter be called simply gradients.

The RF coil unit 108 forms a high-frequency or RF magnetic field for exciting spins in the body of the subject 1, in the static magnetic field space. The formation of the RF magnetic field is hereinafter also called transmission of an RF excitation signal. The RF excitation signal is also called an RF pulse. The RF coil unit 108 receives an electromagnetic wave, i.e., a magnetic resonance signal by which each excited spin is produced. Incidentally, a dedicated coil for receiving each magnetic resonance signal may be provided separately.

A gradient driver 130 is connected to the gradient coil unit 106. The gradient driver 130 applies a drive signal to the gradient coil unit 106 to generate a gradient magnetic field. The gradient driver 130 has unillustrated three-system drive circuits in correspondence with the three-system gradient coils in the gradient coil unit 106.

An RF driver 140 is connected to the RF coil unit 108. The RF driver 140 applies a drive signal to the RF coil unit 108 to transmit RF pulses, thereby exciting each spin in the body of the subject 1.

A data acquisition unit 150 is connected to the RF coil unit 108. The data acquisition unit 150 takes in by sampling, signals received by the RF coil unit 108 and acquires or collects the same as digital data.

A sequence controller 160 is connected to the gradient driver 130, the RF driver 140 and the data acquisition unit 150. The sequence controller 160 controls the gradient driver 130 through the data acquisition unit 150 respectively to perform acquisition of magnetic resonance signals.

The sequence controller 160 is configured using, for example, a computer. The sequence controller 160 has an unillustrated memory. The memory stores a program and various data for the sequence controller 160 therein. The function of the sequence controller 160 is realized by allowing the computer to perform the program stored in the memory.

The output side of the data acquisition unit 150 is connected to a data processor 170. Data acquired by the data acquisition unit 150 are inputted to the data processor 170. The data processor 170 is configured using, for example, a computer or the like. The data processor 170 has an unillustrated memory. The memory stores a program and various data for the data processor 170 therein.

The data processor 170 is connected to the sequence controller 160. The data processor 170 is above the sequence controller 160 in rank and exercises control over the sequence controller 160. The function of the magnetic resonance imaging apparatus is realized by causing the data processor 170 to perform the program stored in the memory.

The data processor 170 stores the data acquired by the data acquisition unit 150 in the memory. A data space is formed in the memory. The data space forms a Fourier space (two-dimensional Fourier space in the exemplary embodiment though two-dimensional and three-dimensional spaces are considered). The Fourier space is hereinafter also called k-space. The data processor 170 performs inverse Fourier transformation on data of k-space to thereby reconstruct an image.

A portion or section comprised of the magnet apparatus 100, the gradient driver 130, the RF driver 140, the data acquisition unit 150, the sequence controller 160 and the data processor 170 is one example of an imaging device.

A display unit 180 and an operation unit 190 are connected to the data processor 170. The display unit 180 is comprised of a graphic display or the like. The operation unit 190 is comprised of a keyboard equipped with a pointing-device, or the like.

The display unit 180 displays the reconstructed image and various information outputted from the data processor 170. The operation unit 190 is operated by a user and inputs various instructions and information or the like to the data processor 170. The user manipulates the magnetic resonance imaging apparatus interactively through the display unit 180 and the operation unit 190.

A perfusion imaging process by the magnetic resonance imaging apparatus of the exemplary embodiment will be explained.

Figure 2:
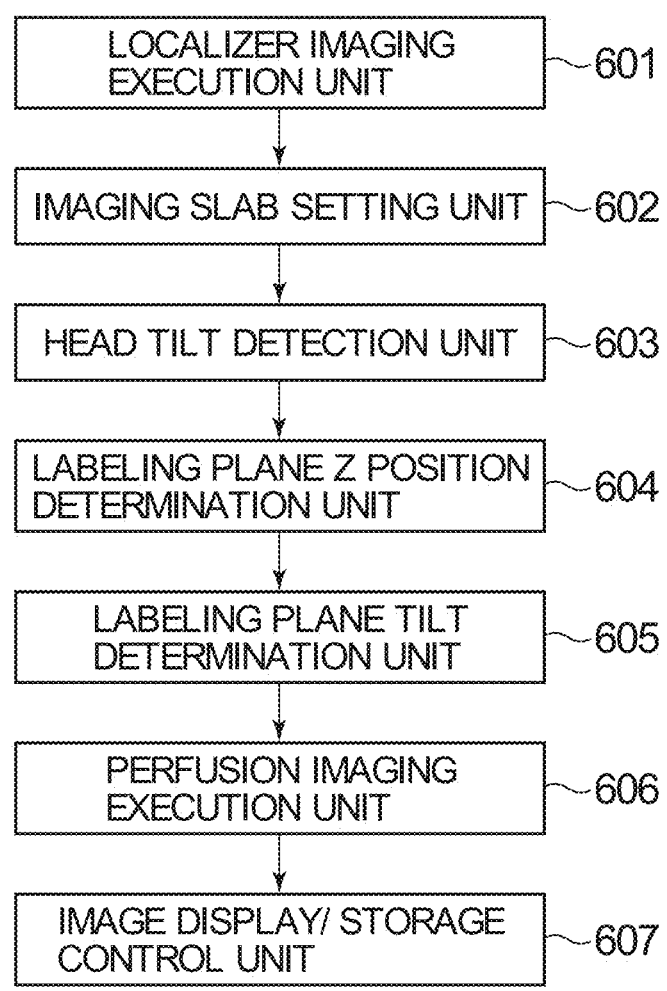
FIG. 2 is a functional block diagram of a portion related to a perfusion imaging process by the magnetic resonance imaging apparatus of the exemplary embodiment.
Figure 3:
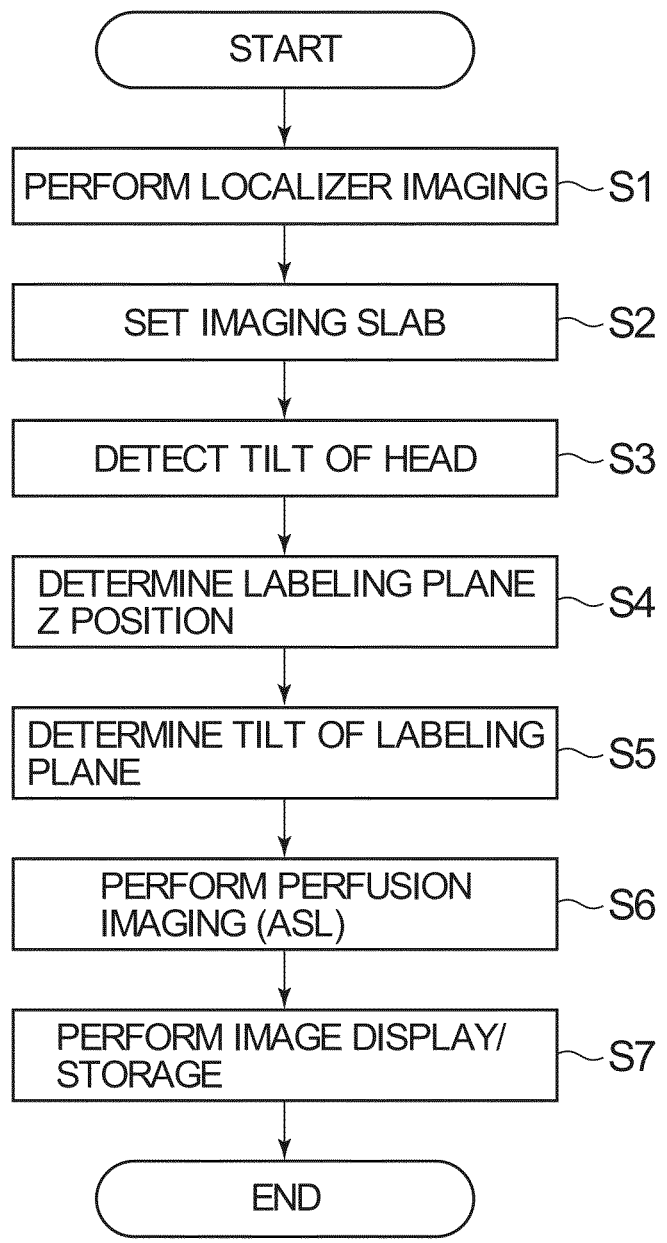
FIG. 3 is a flow diagram showing the perfusion imaging process by the magnetic resonance imaging apparatus of the exemplary embodiment.

A functional block diagram of a portion related to the perfusion imaging process by the magnetic resonance imaging apparatus of the exemplary embodiment is shown in FIG. 2. A flow diagram of the perfusion imaging process by the magnetic resonance imaging apparatus of the exemplary embodiment is shown in FIG. 3.

As shown in FIG. 2, the magnetic resonance imaging apparatus of the exemplary embodiment is equipped with a localizer imaging execution unit 601, an imaging slab setting unit 602, a head tilt detection unit 603, a labeling plane Z position determination unit 604, a labeling plane tilt determination unit 605, a perfusion imaging execution unit 606 and an image display/storage control unit 607.

At step S1, the localizer imaging execution unit 601 performs localizer imaging. The localizer imaging is one preliminary imaging of the subject 1 and is performed to acquire information necessary to set imaging conditions used in perfusion imaging.

Figure 4:
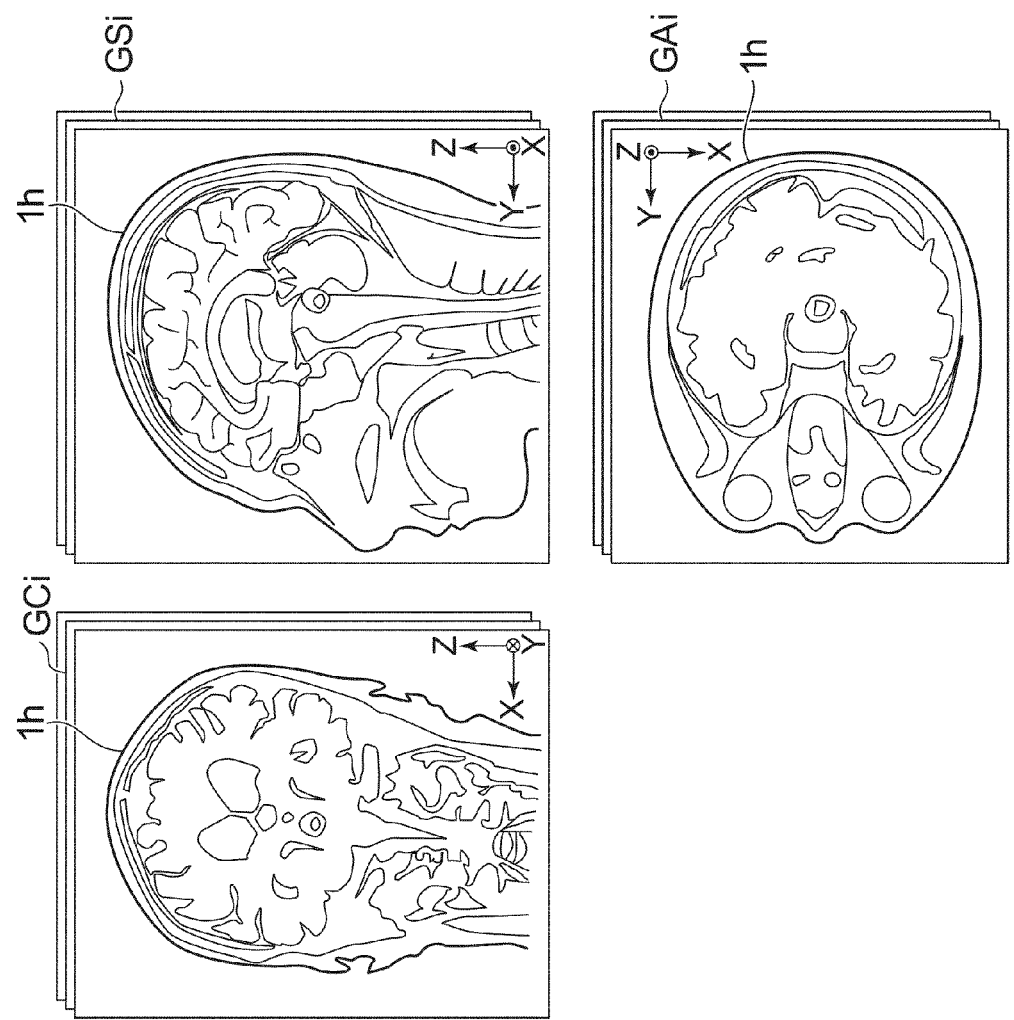
FIG. 4 is a diagram showing one example illustrative of localizer images.

FIG. 4 shows one example illustrative of localizer images obtained by the localizer imaging. Here, as shown in FIG. 4, for example, axial tomographic images GAi of a plurality of slices, sagittal tomographic images GSi of a plurality of slices, and coronal tomographic images GCi of a plurality of slices are obtained as localizer images.

At step S2, the imaging slab setting unit 602 sets each imaging slab (imaging area).

Figure 5:
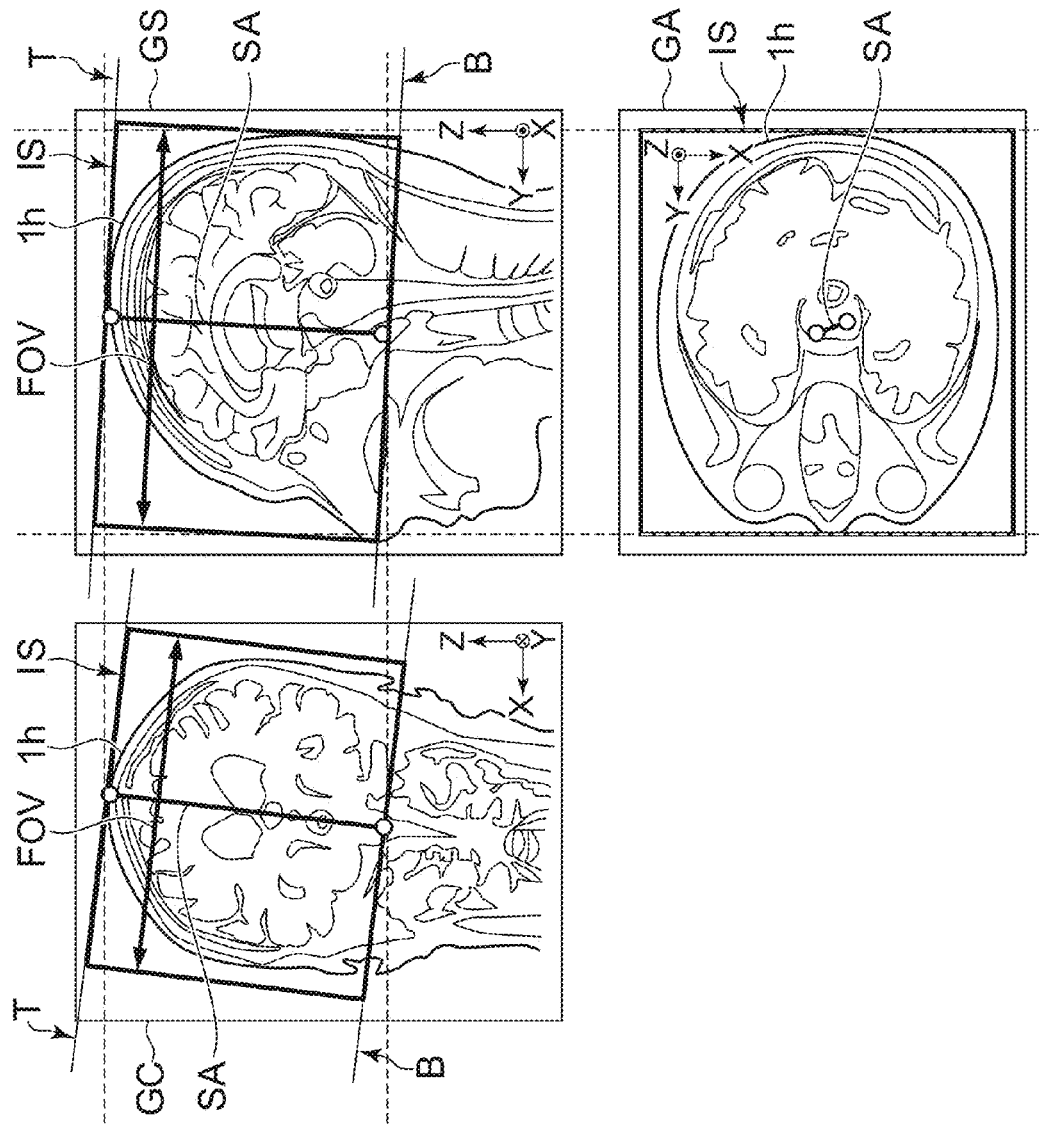
FIG. 5 is a diagram illustrating an example in which imaging slabs are set.

FIG. 5 shows an example in which imaging slabs IS are set. As shown in FIG. 5, for example, an axial tomographic image GA, a sagittal tomographic image GS and a coronal tomographic image GC in each of which the neighborhood of the center of a head 1h is included in its section, are displayed on the screen of a monitor. A user designates a three-dimensional area so as to surround the cerebral parenchymal portion of the head 1h by GUI (Graphical User Interface) on the screen. The imaging slab setting unit 602 sets the designated three-dimensional area as each imaging slab IS. The imaging slab IS is defined by setting, for example, a slice axis SA, an upper end face (downstream side of cerebral artery blood flow) T and a lower end face (upstream side of cerebral artery blood flow) B with the slice axis SA as a normal line, and an imaging field-of-view area FOV perpendicular to the slice axis SA with the slice axis SA as the center. Incidentally, the slice axis SA is normally set so as to overlap with the axis of the head 1h.

At step S3, the head tilt detection unit 603 detects the tilt of the head 1h with respect to the direction of the body axis of the subject 1, i.e., the Z-axis direction, based on geometric information of the set imaging slab IS. When the head 1h is tilted, the arteries lying around the lower part of the circle of Willis are moved and transformed. When the arteries lying around the lower part of the circle of Willis are tilted, the tilt of an area to perform spin's labeling also changes. Therefore, the tilt of the head 1h is detected in advance and information about its tilt is used in determination of the tilt of the area to perform labeling. According to the investigation of the inventors, however, the degree of the tilt of each artery lying around the lower part of the circle of Willis differs depending on the direction of tilting of the head 1h. Therefore, the area to perform labeling should not be tilted uniformly in the same direction as the tilt of the head and at the same rotational angle as its tilt. This point of view will be explained below.

Figure 6:
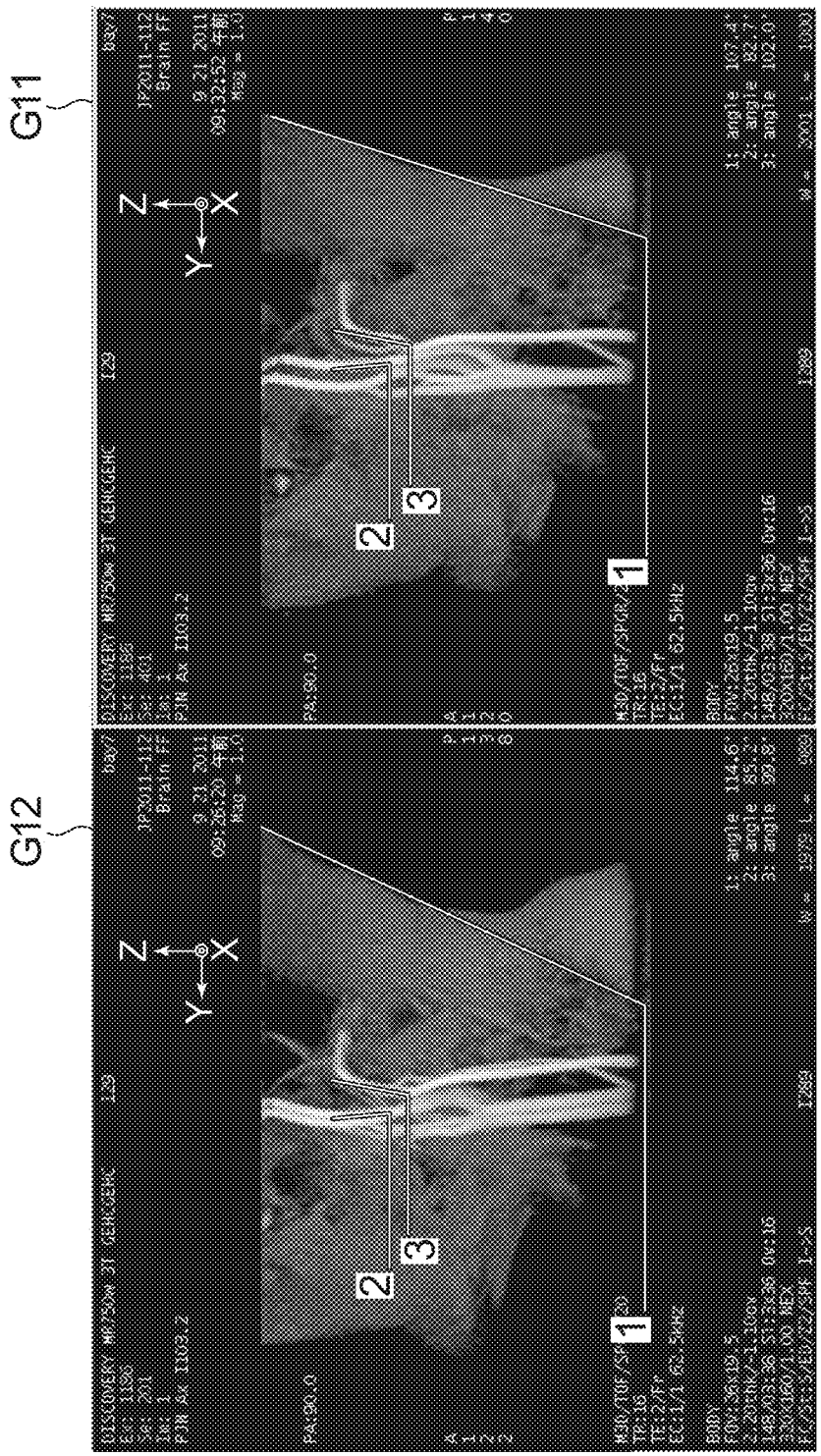
FIG. 6 is a diagram showing positional changes in arteries when the head is rotated about an RL (Right-Left) axis.
Figure 7:
FIG. 7 is a diagram showing positional changes in arteries when the head is rotated about an AP axis.

FIG. 6 shows sagittal images of the head and is a diagram showing changes in the tilts of the arteries lying around the lower part of the circle of Willis when the head is rotated about an RL (Right-Left) axis. FIG. 7 shows coronal images of the head and is a diagram showing changes in the tilts of the arteries lying around the lower part of the circle of Willis when the head is rotated about an AP (Antero-Posterior) axis.

In the example of FIG. 6, as understood from an angular change in angle 1 (its display is at the lower right in the drawing) in FIG. 6, the axis of the head is changed from a state (G11) in which it approximately coincides with the Z-axis direction to a state (G12) in which it is rotated about 10° about the RL axis (X-axis in the present embodiment) and tilted. In this case, as understood from angles 2 and 3 (their displays are at the lower right in the drawing) in FIG. 6, the arteries lying around the lower part of the circle of Willis are rotated only about 2° to 3° about the RL axis. It is understood from this that the movement and transformation of the arteries lying around the lower part of the circle of Willis do not almost depend on the rotation of the head about the RL axis of the head. That is, even if the axis of the head is rotated about the RL axis, the symmetry of the right and left carotid arteries with respect to the Z-axis (SI axis) is approximately held. Thus, even though a labeling plane LP remains set in such a manner that its normal direction coincides with the Z-axis direction as usual, a shift in timing of labeling relative to a blood flow for each artery does not almost occur.

On the other hand, in the example of FIG. 7, as understood from an angular change in angle 1 (its display is at the lower right in the drawing) in FIG. 7, the axis of the head is changed from a state (G21) in which it approximately coincides with the Z-axis direction to a state (G22) in which it is rotated about 10° about the AP axis (Y-axis in the present embodiment) and tilted. In this case, as understood from angles 2 and 3 (their displays are at the lower right in the drawing) in FIG. 7, the arteries lying around the lower part of the circle of Willis are rotated about 9° about the AP axis. It is understood from this that the movement and transformation of the arteries lying around the lower part of the circle of Willis greatly depend on the rotation of the head about the AP axis, and its tilt nearly follows the angle of rotation of the head about the AP axis. That is, when the axis of the head is rotated about the AP axis, the symmetry of the right and left carotid arteries with respect to the Z-axis (SI axis) is broken. Thus, when the labeling plane LP remains set in such a manner that its normal direction coincides with the Z-axis direction as usual, a shift in timing of labeling relative to a blood flow for each artery occurs.

Thus, a rotational angular component of the axis of the head 1h about the AP axis is determined as the tilt of the head 1h herein. Thereafter, the labeling plane is so tilted that its normal line is rotated by a rotational angle corresponding to the rotational angular component about the AP axis relative to the Z-axis direction.

A description will made of how to determine the rotational angular component of the head 1h about the AP axis. As described above, the slice axis SA of the imaging slab IS is normally set so as to overlap with the axis of the head 1h. Therefore, the slice axis SA of the imaging slab IS is detected as the axis of the head 1h. Then, the tilt of the axis of the head 1h relative to the body axial direction, i.e., Z-axis direction is represented in a three-dimensional rotation matrix from the Z-axis direction. The rotational angular component about the AP axis is determined based on matrix elements of the three-dimensional rotation matrix. A concrete example will be shown below.

As one example of representation of the three-dimensional rotation matrix, Euler angles $\alpha$, $\beta$ and $\gamma$ can be used. That is, consider the following three-dimensional rotation matrix of a Z—X—Z series having rotational angles of Euler angles $\alpha$, $\beta$ and $\gamma$.

$$Rz(\alpha), Rx'(\beta), Rz'(\gamma) \quad (1)$$

where the rotational angular component of the head 1h about the AP axis is expressed in $\alpha$, and the tilt of the axis of the head 1h is denoted in the following rotation matrix.

$$R(\alpha,\beta,\gamma) \quad (2)$$

At this time, the following relation is established:

$$R(\alpha,\beta,\gamma)=Rz(\alpha)Rx'(\beta)Rz'(\gamma) \quad (3)$$

It is generally known that in an arbitrary three-dimensional rotation matrix $R(\alpha, \beta, \gamma)$, Euler angles $\alpha$, $\beta$, $\gamma$ can uniquely be derived from its matrix elements.

Therefore, first, the tilt of the axis of the head 1h is determined considering that the tilt thereof coincides with the tilt of the slice axis SA of the imaging slab IS from the Z-axis direction. Next, the three-dimensional rotation matrix $R(\alpha, \beta, \gamma)$ indicative of the tilt of the axis of the head 1h is determined in the form of $Rz(\alpha) Rx'(\beta) Rz'(\gamma)$. An Euler angle $\alpha$ at this time is determined as the rotational angular component of the head 1h about the AP axis.

Incidentally, the three-dimensional rotation matrix indicative of the tilt of the axis of the head 1h is not limited to one using the above Euler angle. The three-dimensional rotation matrix may be, for example, a three-dimensional rotation matrix using the roll, pitch and yaw angle r, p and y of a Z—Y—X series or a three-dimensional rotation matrix using the definition of rotational angles about fixed axes of X, Y and Z. Even if any three-dimensional rotation matrix is used, the rotational angular component about the AP axis can be determined as its matrix element.

Incidentally, the head tilt detection unit 603 may detect the tilt of the head 1h from the result of analysis of each localizer image. The tilt of the head 1h, particularly, the rotational angle thereof about the AP axis is detected from, for example, template matching of the cerebral parenchymal portion, positional relations between anatomical feature points such as branch points, bent points and the like of the arteries lying around the circle of Willis, a left-to-right positional relation between the outlines of both ears, etc.

At step S4, the labeling plane Z position determination unit 604 determines a labeling plane Z position. The labeling plane Z position can be defined as, for example, a position in the Z-axis direction, of a point corresponding to the center of the imaging field-of-view area FOV at the labeling plane LP.

Figure 8:
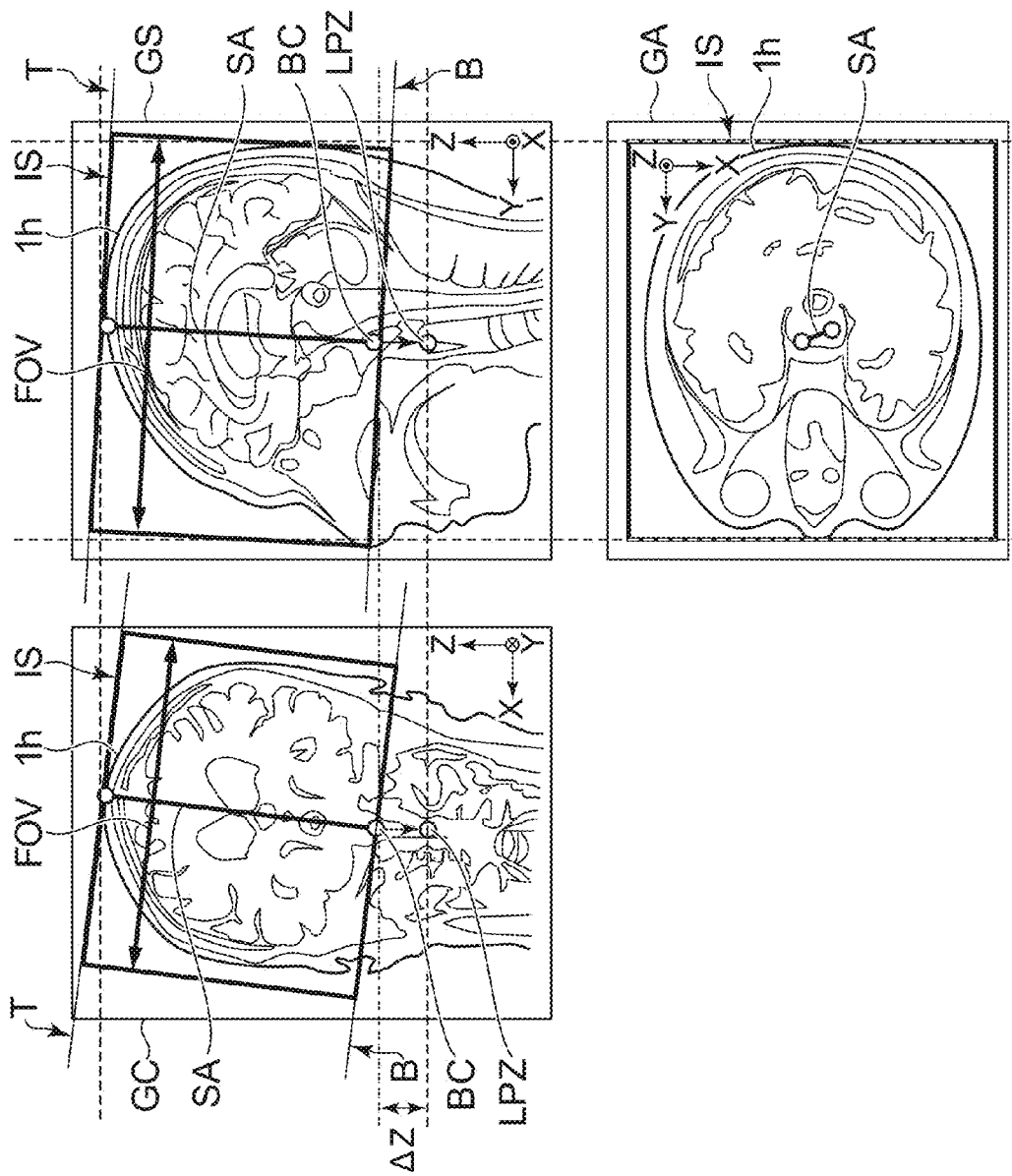
FIG. 8 is a diagram showing an example in which a labeling plane Z position is determined.

FIG. 8 shows an example in which the labeling plane Z position is set. As shown in FIG. 8, for example, a position moved by a predetermined distance ΔZ from a point BC corresponding to the center of an imaging field-of-view area FOV at a lower end face B of each imaging slab IS to therebelow, i.e., the upstream side of the carotid artery blood flow as viewed in the Z-axis direction is determined as a labeling plane Z position LPZ. The distance ΔZ is about 2 cm, for example. Upon perfusion imaging, the imaging slab IS is normally set to surround a specific anatomical feature portion including a cerebral parenchymal portion. Therefore, when the labeling plane Z position is determined in this manner, the labeling plane LP can experientially be set to an ideal position where the branches and flexion of blood vessels in the head are reduced, the position being away a few cm from the lower part of the circle of Willis where there is not tilt of the head 1h with respect to the Z-axis direction.

Incidentally, the labeling plane Z position determination unit 604 may decide the labeling plane Z position by such a method as disclosed in Japanese Unexamined Patent Publication No. 2012-61074. That is, a relationship in position between a template of a standard model brain and the optimum labeling plane is defined in advance. Template matching of the brain may be performed on each localizer image to determine the optimum position of the labeling plane in the Z-axis direction. Alternatively, relations in position between anatomical feature points of various arteries and the optimum labeling plane are defined in advance. Then, the anatomical feature points of the various arteries may be extracted from the localizer image to determine the optimum position of the labeling plane in the Z-axis direction.

At step S5, the labeling plane tilt determination unit 605 determines the tilt of the labeling plane LP. The tilt of the labeling plane LP can be defined as, for example, a rotational angle from the Z-axis direction, of the normal line of the labeling plane LP.

Figure 9:
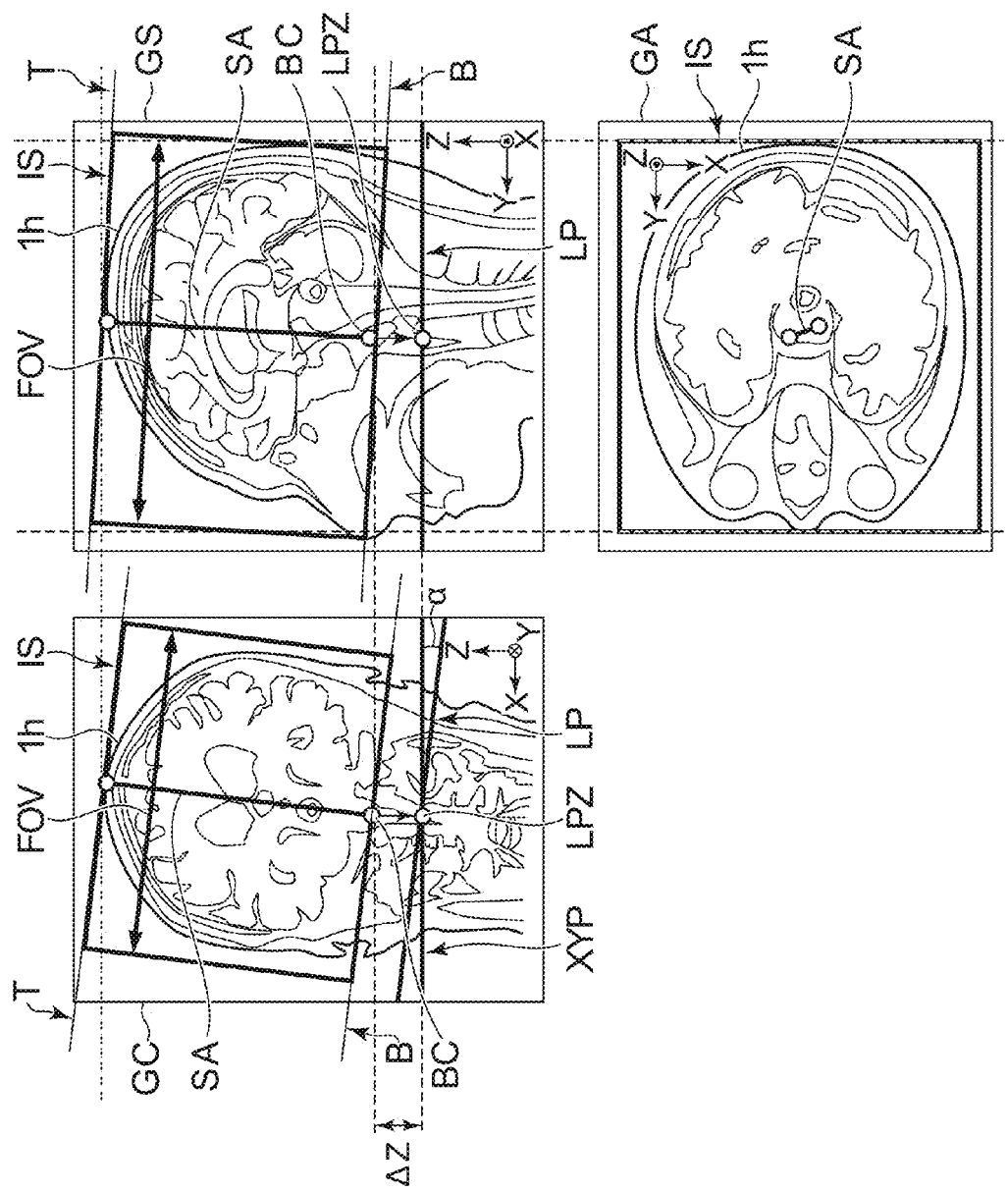
FIG. 9 is a diagram showing an example in which the tilt of a labeling plane is determined.

FIG. 9 shows an example in which the tilt of the labeling plane LP is determined. As shown in FIG. 9, for example, the tilt a of the labeling plane LP is determined as a tilt obtained when it is rotated about the AP axis by substantially the same rotational angle as the rotational angular component a of the axis of the head 1h about the AP axis, which has been detected at step S2. That is, the labeling plane LP is set as one obtained by placing a plane vertical in a Z-axis direction in the previously-determined labeling plane Z position and rotating the plane using a rotation matrix Rz (α).

At step S6, the perfusion imaging execution unit 606 performs perfusion imaging based on an ASL method in accordance with the set imaging slab IS and labeling plane LP.

Figure 10:
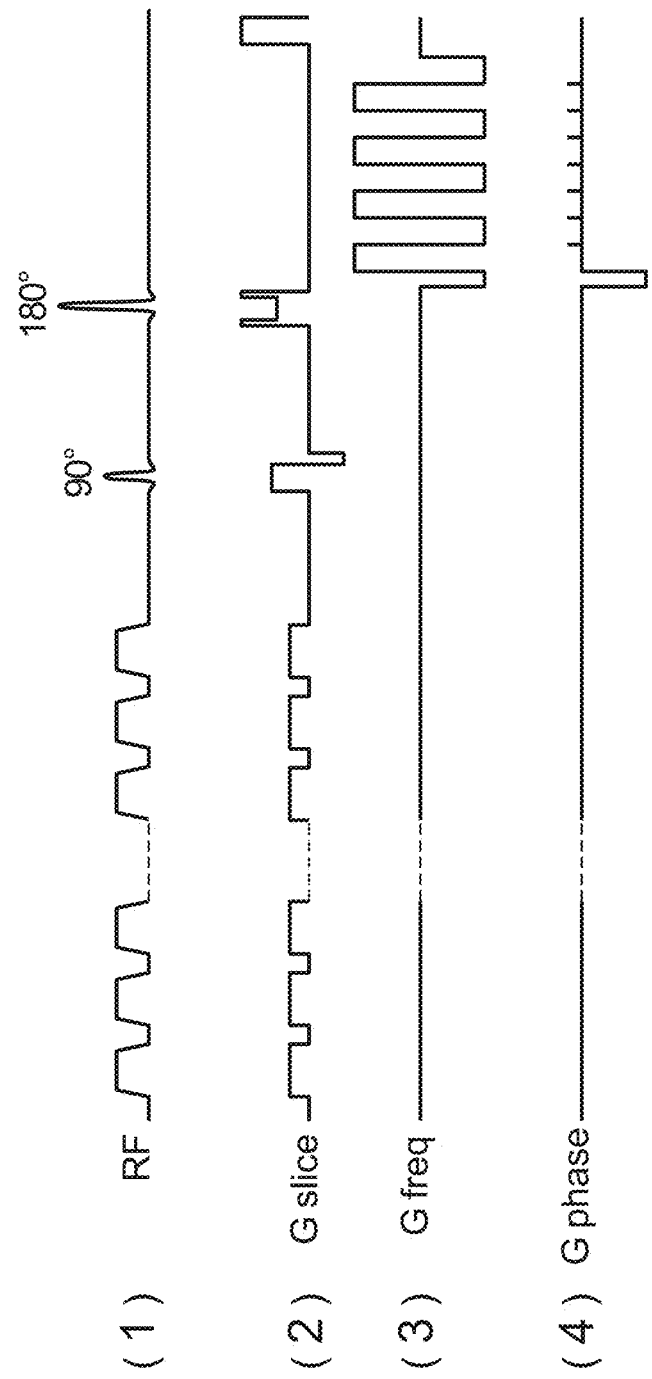
FIG. 10 is a diagram showing a pulse sequence for imaging of a label image.
Figure 11:
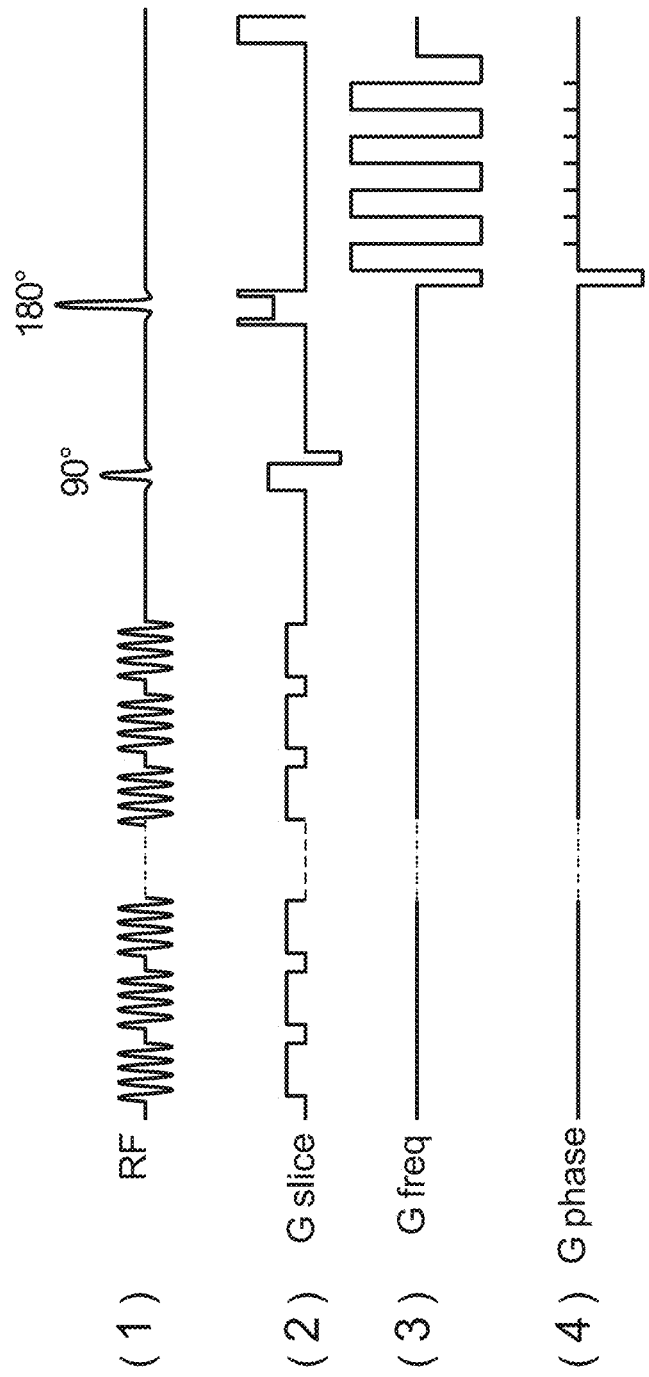
FIG. 11 is a diagram showing a pulse sequence for imaging of a control image.

FIGS. 10 and 11 respectively show one example illustrative of pulse sequences used in perfusion imaging. The perfusion imaging by the pulse sequences is called CASL (Continuous Arterial Spin Labeling). In ASL methods such as CASL, PASL, etc., a label image being a tomographic image with labeling, and a control image being a tomographic image with no labeling are imaged, and a perfusion image is determined as an image of a difference between these images.

FIG. 10 is a pulse sequence for imaging of the label image, and FIG. 11 is a pulse sequence for imaging of the control image. The pulse sequence proceeds to left to right. In both drawings, (1) shows a pulse sequence of an RF magnetic field. Any of (2) through (4) shows a pulse sequence of a gradient magnetic field. (2) is a slice gradient, (3) is a frequency encode gradient, and (4) is a phase encode gradient, respectively. Incidentally, a static magnetic field is always applied with a constant magnetic field intensity.

In the pulse sequence of FIG. 10, labeling of spins at the labeling plane LP is first performed. The labeling is performed by inversion pulses of rectangular wave applied a predetermined number of times with a predetermined duty ratio. Thus, labeling by inversion is performed on spins in the arterial blood. The spins subjected to the labeling are perfused in the imaging slab IS through each artery.

The magnet apparatus 100, the gradient driver 130, the RF driver 140 and the sequence controller 160 are concerned in the spin labeling.

After the labeling, imaging is performed on the imaging slab IS. The imaging is performed by echo planar imaging (EPI). That is, spin excitation based on a 90° pulse is performed on the imaging slab. After a predetermined time of the 90° excitation, 180° excitation is performed thereon. Next, a frequency encode gradient Gfreq and a phase encode gradient Gphase are applied in a predetermined sequence to sequentially acquire or collect a plurality of spin echoes, i.e., view data. The so-obtained view data are collected in the memory of the data processor 170. k-space is formed in the memory. The k-space is k-space used for the label image.

In the pulse sequence of FIG. 11, RF excitation of each spin at the labeling plane LP is first performed. The RF excitation is performed by sinusoidal RF pulses applied a predetermined number of times with a predetermined duty ratio.

The signal intensity of each RF pulse is equivalent to that of each inversion pulse in the pulse sequence of FIG. 10, but spin's inversion is not performed as a whole because of the sine wave. This RF excitation is performed to make a saturation effect of each spin on the imaging slab IS identical to the inversion pulse in FIG. 10.

After such a spin operation, imaging is performed on the imaging slab. The imaging is performed by EPI. That is, spin excitation based on a 90° pulse is performed on the imaging slab IS. After a predetermined time of the 90° excitation, 180° excitation is performed thereon. Next, a frequency encode gradient Gfreq and a phase encode gradient Gphase are applied in a predetermined sequence to sequentially acquire or collect a plurality of spin echoes, i.e., view data. The so-obtained view data are collected in the memory of the data processor 170. k-space is formed in the memory. The k-space is k-space used for the control image.

Figure 12:
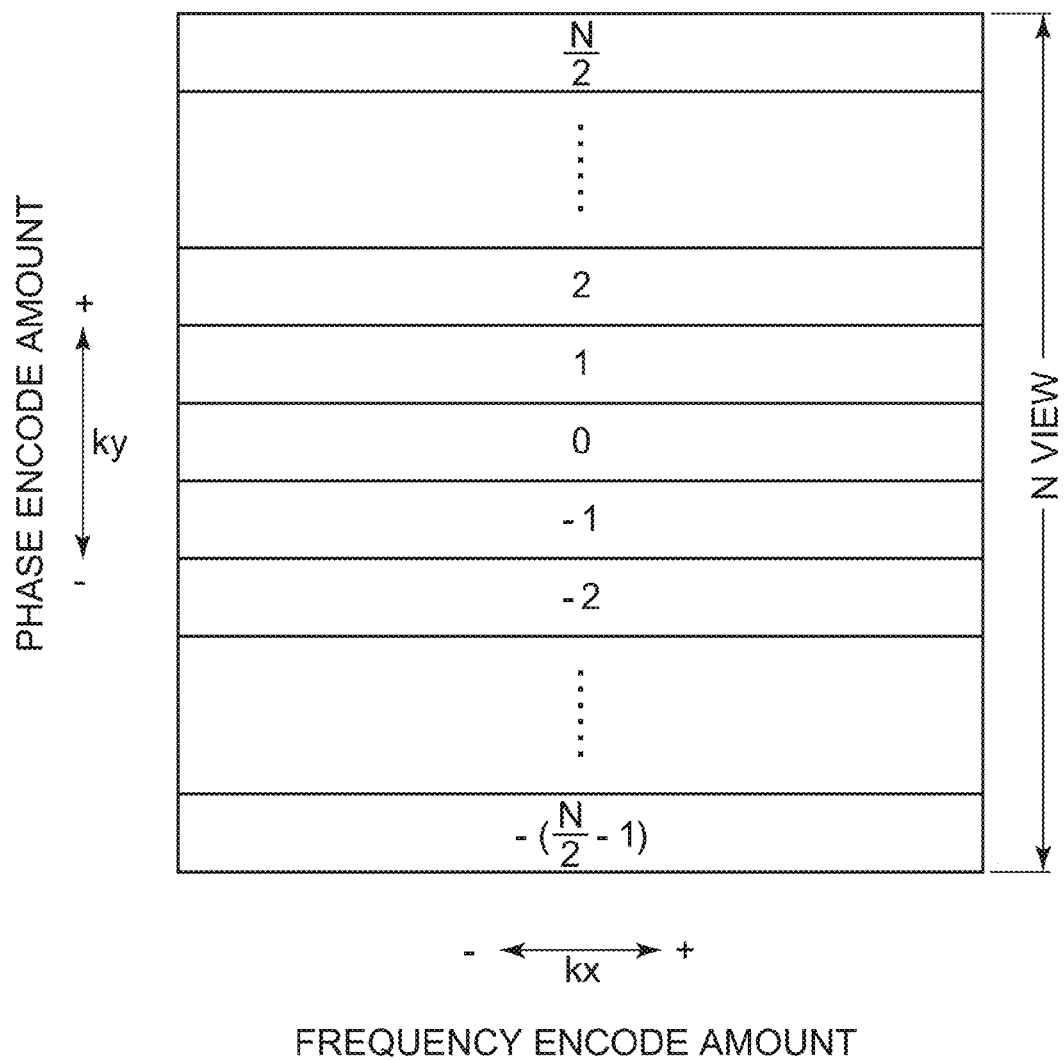
FIG. 12 is a diagram illustrating the concept of k-space.

FIG. 12 shows a conceptual diagram of k-space. In the k-space, the horizontal axis kx indicates a frequency axis, and the vertical axis ky indicates a phase axis. In the same drawing, a plurality of landscape-oriented rectangles respectively indicate view data. Each of numerals entered in the rectangles indicates a phase encode amount. The phase encode amount is normalized in π/N. N ranges from 64 to 512. The phase encode amount is 0 at the center of the phase axis ky. The phase encode amount gradually increases from the center to both ends. The polarities of increases thereof are opposite to each other.

Such k-spaces are respectively formed with respect to the label image and the control image. The data processor 170 inverse Fourier-transforms the view data in their k-spaces respectively and thereby reconstructs the label and control images respectively.

The data processor 170 further determines an image of a difference between the label and control images. The difference image becomes an image based on only magnetic resonance signals in which spins subjected to inversion, i.e., labeling are produced. Thus, the difference image becomes a perfusion image.

At step S7, the image display/storage control unit 607 causes the display unit 180 to display the perfusion image and allows its memory to store data about the perfusion image.

According to the exemplary embodiment as described above, since the tilt of the labeling area is determined based on the tilt of the head correlated with the area suitable for the labeling, the area suitable for the labeling can be determined as the labeling area upon the imaging based on the ASL method without depending on the posture of the head.

According to the exemplary embodiment as well, since the labeling plane is rotated about the AP axis by the rotational angle corresponding to the rotational angular component of the head about the AP axis, the tilt of the labeling plane can be determined based on only the rotational angular component that principally contributes to the movement of tilting of the arteries lying around the lower part of the circle of Willis within the tilt of the head. It is possible to adjust the tilt of a labeling plane that is efficient and high in accuracy.

Incidentally, the disclosure is not limited to the above-described exemplary embodiment. Various modification/addition and the like are made possible within the scope and without departing from the spirit of the invention.

For example, the method of mathematically representing the tilt of the axis of the head and the method of extracting the rotational angular component of the axis of the head about the AP axis are not limited to the above examples. All types of methods known can be used.

When the tilt of the axis of the head is smaller than a predetermined level, for example, the tilt of each artery lying around the lower part of the circle of Willis is determined to be small. The labeling plane may be set as the plane perpendicular in the Z-axis direction as usual without its tilting.

In the exemplary embodiment, for example, the labeling plane thin in thickness as viewed in the blood flow direction, but a labeling slab thicker in the blood flow direction may be determined.

For example, the determination of the labeling plane such as described above is applicable to perfusion imaging by PASL (Pulse Arterial Spin Labeling), EPISTAR (Echo Planar Imaging and Signal Targeting with Alternating Radio Frequency), QUIPSS II (Quantitative Imaging of Perfusion Using a Single Subtraction II) or the like as well as to the perfusion imaging based on CASL.

Many widely different embodiments may be configured without departing from the spirit and the scope of the present invention. It should be understood that the present invention is not limited to the specific embodiments described in the specification, except as defined in the appended claims.

What is claimed is:

1. A magnetic resonance apparatus comprising:
    a detecting device which is configured to detect a tilt of a head relative to a body axis direction of a subject to be imaged by an arterial spin labeling method; and
    a determining device configured to determine a tilt of a labeling area of spins relative to the body axial direction of the subject, based on the tilt of the head detected by the detecting device.

2. The magnetic resonance apparatus according to claim 1, wherein the detecting device is configured to detect the tilt of the head, based on a slice direction of an imaging set of the head.

3. The magnetic resonance apparatus according to claim 2, wherein the detecting device is configured to detect a rotational angular component of the head about an anterior posterior (AP) axis, and wherein the determining device is configured to determine the tilt of the labeling area, based on the rotational angular component.

4. The magnetic resonance apparatus according to claim 1, wherein the detecting device is configured to detect the tilt of the head, based on a result of analysis of a preliminary image of the head.

5. The magnetic resonance apparatus according to claim 4, wherein the detecting device is configured to detect a rotational angular component of the head about an anterior posterior (AP) axis, and wherein the determining device is configured to determine the tilt of the labeling area, based on the rotational angular component.

6. The magnetic resonance apparatus according to claim 1, wherein the detecting device is configured to detect a rotational angular component of the head about an anterior posterior (AP) axis, and wherein the determining device is configured to determine the tilt of the labeling area, based on the rotational angular component.

7. The magnetic resonance apparatus according to claim 6, wherein the determining device is configured to determine the tilt of the labeling area such that a perpendicular direction to the labeling area becomes a direction rotated about the AP axis by a rotational angle corresponding to the rotational angular component from the body axial direction.

8. The magnetic resonance apparatus according to claim 7, wherein the detecting device is configured to determine a three-dimensional rotation matrix indicative of the tilt of the head and configured to detect a rotational angular component about the AP axis, based on matrix elements of the three-dimensional rotation matrix.

9. The magnetic resonance apparatus according to claim 6, wherein the detecting device is configured to determine the tilt of the labeling area such that a perpendicular direction to the labeling area becomes a direction rotated about the AP axis by a rotational angle corresponding to the rotational angular component from the body axial direction.

10. The magnetic resonance apparatus according to claim 9, wherein the detecting device is configured to determine a three-dimensional rotation matrix indicative of the tilt of the head and configured to detect a rotational angular component about the AP axis, based on matrix elements of the three-dimensional rotation matrix.

11. The magnetic resonance apparatus according to claim 6, wherein the detecting device is configured to determine a three-dimensional rotation matrix indicative of the tilt of the head and configured to detect a rotational angular component about the AP axis, based on matrix elements of the three-dimensional rotation matrix.

* * * * *